(12) United States Patent
Eickel

(10) Patent No.: US 12,040,032 B2
(45) Date of Patent: Jul. 16, 2024

(54) ELECTRONIC CIRCUIT AND METHOD FOR SELF-DIAGNOSIS OF A DATA MEMORY

(71) Applicant: Dream CHIP Technologies GmbH, Garbsen (DE)

(72) Inventor: Karl Heinz Eickel, Bremen (DE)

(73) Assignee: Dream CHIP Technologies GmbH, Garbsen (DE)

( * ) Notice: Subject to any disclaimer, the term of this patent is extended or adjusted under 35 U.S.C. 154(b) by 0 days.

(21) Appl. No.: 18/018,211

(22) PCT Filed: Sep. 29, 2021

(86) PCT No.: PCT/EP2021/076800
§ 371 (c)(1),
(2) Date: Jan. 26, 2023

(87) PCT Pub. No.: WO2023/051903
PCT Pub. Date: Apr. 6, 2023

(65) Prior Publication Data
US 2024/0013847 A1    Jan. 11, 2024

(51) Int. Cl.
*G11C 29/00* (2006.01)
*G11C 29/42* (2006.01)
*G11C 29/44* (2006.01)

(52) U.S. Cl.
CPC .............. *G11C 29/42* (2013.01); *G11C 29/44* (2013.01)

(58) Field of Classification Search
CPC ... G11C 29/42; G11C 29/44; G11C 29/56008; G11C 29/52
See application file for complete search history.

(56) References Cited

U.S. PATENT DOCUMENTS 8,832,524 B2 * 9/2014 Bennett ............. H03M 13/2942
714/763
9,047,214 B1 * 6/2015 Northcott .............. G06F 11/108
(Continued)

FOREIGN PATENT DOCUMENTS

| CN | 112181709 A | 1/2021 |
| JP | S6220036 A | 1/1987 |
| JP | H-08263391 A | 10/1996 |

OTHER PUBLICATIONS

G. Tosenovjan: Error correction codes implemented on MPC55XX and MPC56XX devices, NXP-free scale semiconductor Application note, Document No. AN5200, rev. 1, Dec. 2015.
(Continued)

*Primary Examiner* — Esaw T Abraham
(74) *Attorney, Agent, or Firm* — KUSNER & JAFFE

(57) ABSTRACT

An electronic circuit and method for self-diagnosis of a data memory (RAM) is described comprising/using a first error correction code unit ($ECCGEN_1$) for generating an error correction code ($ECC_{IN}$) from user data ($D_{IN}$) to be written into the data memory (RAM). The electronic circuit is arranged to feed the user data ($D_{IN}$) written into the memory and the related error correction code ($ECC_{IN}$) into the error check unit (ECCCHK/CORR) in the write cycle when writing the user data and the related error correction code ($ECC_{IN}$) into the data memory (RAM) to provide a Latent Fault flag in case of a determined difference between the error correction code ($ECC_{IN}$) and the countercheck code ($CCC_{IN}$) calculated from the user data ($D_{IN}$) by the error check unit (ECCCHK/CORR).

16 Claims, 7 Drawing Sheets

(56) References Cited

U.S. PATENT DOCUMENTS

| | | | |
|---|---|---|---|
| 9,646,716 B2 * | 5/2017 | Goessel | G11C 29/10 |
| 9,904,595 B1 | 2/2018 | Jalan et al. | |
| 10,025,652 B2 * | 7/2018 | Bandic | G06F 11/0772 |
| 10,114,693 B2 * | 10/2018 | Kim | G06F 11/1044 |
| 10,162,702 B2 * | 12/2018 | Yao | H03M 13/2906 |
| 10,379,946 B2 * | 8/2019 | Ueda | G06F 11/0751 |
| 10,580,513 B2 * | 3/2020 | Maeda | G11C 29/52 |
| 10,802,077 B1 | 10/2020 | Srinivasan et al. | |
| 11,095,316 B2 * | 8/2021 | Ha | G06F 11/1012 |
| 11,144,391 B2 * | 10/2021 | Brooks | G06F 11/102 |
| 2007/0061669 A1 | 3/2007 | Major et al. | |
| 2020/0167230 A1 | 5/2020 | Min | |

OTHER PUBLICATIONS

International Search Report from corresponding International Patent Application No. PCT/EP21/76800, dated Jun. 27, 2022.

ECC (Error Checking and Correcting or Error Correction Code) definition in German and English, Editing ComputerWeekly.de, TechTarget, https://www.computerweekly.com/de/definition/ECC-Error-Checking-and-Correcting-oder-Error-Correction-Code.

Doe Hyun Yoon, et al., "Memory Mapped ECC: Low-Cost Error Protection for Last Level Caches," ACM SIGARCH Computer Architecture News, vol. 37, Issue 3, Jun. 2009, 12 pages.

* cited by examiner

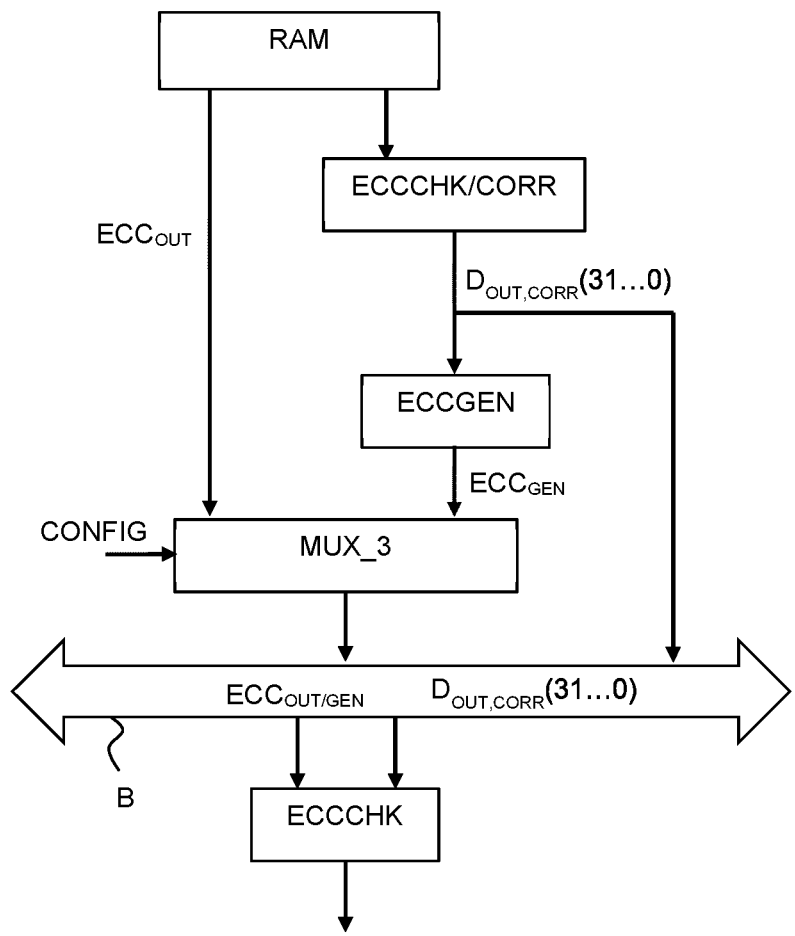
Fig. 6)

ELECTRONIC CIRCUIT AND METHOD FOR SELF-DIAGNOSIS OF A DATA MEMORY

FIELD OF THE INVENTION

The invention relates to an electronic circuit and method for self-diagnosis of a data memory.

BACKGROUND OF THE INVENTION

When storing data electronically in a data memory, malfunctions can occur due to several reasons.

In order to detect memory data corruption, error correction codes are used to detect and correct n-bit data corruption occurring in data memory. Such errors can be caused by bits flipping due to several reasons.

It is known to write extra memory bits to record a parity of a data string (e.g. a single byte or a plurality of bytes) which allows the detection of all single-bit errors. It is further known to use an error-correction code (ECC) which is computed from the user data to be written into the data memory and stored together with the user data into the data memory. Error correction codes, like single-error correction and double-error correction Hamming-Codes, allows a single-bit error to be corrected and double-bit errors to be detected. This can be combined with the use of an extra parity bit. Error correction codes are also known to correct multiple-bit errors. Error correction code functions can be implemented in hardware together with the logic of a data memory device.

G. Tosenovjan: Error correction codes implemented on MPC55XX and MPC56XX devices, NXP-free scale semiconductor Application note, Document no. AN5200, rev. 1, December 2015 describes an error correction code function utilized with a data memory in applications where data corruptions via soft-errors are not easily tolerated. Single errors are corrected and double errors are detected and indicated for example by an ECC error interrupt.

A 1-bit-error can be "physically" repaired by reading the data out of the data memory and writing them back after correction.

JP-H-08263391 A discloses a memory device comprising a test method of a random access memory (RAM) for storing an error correction code (ECC). The memory device includes a RAM for storing ECC in an ECC generation circuit, and an error correction/detection circuit. In the memory device, an ECC is generated by the ECC generation circuit from the write data received from a memory control device. In the error correction/detection circuit, a syndrome is generated from the ECC of the address indicated by the signal line of the RAM. If the result of the error detected by the syndrome is a 1-bit-error, the error corrected data is set in the register and the 1-bit error information is set in the error flag. In the case of a 2-bit-error, the 2-bit-error information is set in the error flag, and the content of the error flag is reported to the memory control device by the signal line.

US 2020/0167230 A1 discloses a method and apparatus for self-diagnosis of RAM error detecting logic of a power train controller comprising an error correction code (ECC) module including an ECC comparator.

SUMMARY OF THE INVENTION

A self-diagnosis of RAM error detection logic is provided to diagnose whether an error occurs in the RAM error detection logic or error correction code ECC-module. A test is performed on the error correction code module corresponding to a RAM operating in conjunction with a second core of a microcontroller unit in a specific test operation of a test mode.

When the test of each ECC-module is performed, the test performed by each core includes checking whether an error detection function properly operates through a first task for performing an OR input on a designated value so that an error occurs in a test bit input port of an ECC comparator, checking whether an error detection function properly operates through a second task for a correctable error test in which one bit of input data actually inputs through the input port of the ECC comparator is flipped and input and checking whether an error detection function properly operates through a third task for an uncorrectable error test in which two bits of input data actually inputs through the input port of the ECC comparator are flipped.

According to one aspect of the invention, an electronic circuit for self-diagnosis of a data memory includes:

a first error correction code unit for generating an error correction code from user data written into the data memory, wherein the electronic circuit is arranged to write the user data and the related error correction code into the data memory; and an error check unit for calculating a countercheck code from user data which are read out from the data memory, and comparing the countercheck code with the error correction code which is read out of the memory together with the related user data wherein the error check unit is arranged to provide an error flag in case of a difference between the error check code and the countercheck code.

According to another aspect of the invention, a method for self-diagnosis of a data memory includes:

a) a write cycle comprising the steps of:
  computing an error correction code from user data provided to be written into the data memory;
  storing the computed error correction code and the related user data into the data memory;
b) and a read cycle comprising the steps of:
  reading user data and the related stored error correction code from the data memory;
  computing a countercheck code from the user data read out from the data memory; and
  comparing the error correction code read out from the data memory with the countercheck code to provide an error flag indicating a malfunction of the data memory in case of a mismatch.

The present invention provides an improved electronic circuit and method for easily and safely monitoring malfunctions of the error correction code unit provided for generating an error correction code (ECC) from the user data.

In one embodiment, the electronic circuit is arranged to feed the user data written into the data memory and the related error correction code into the error check unit in a write cycle when writing the user data and the related error correction code into the data memory to provide a latent fault flag in case of a determined difference between the error correction code and the countercheck code.

The latent fault flag indicates an error occurring in the error correction code unit. Therefore, the function of the error correction code unit can be easily monitored without additional time required and with only minor hardware and/or software resources.

Thus, in accordance with the present invention, the error check unit which is designed for the read cycle to check the stored error correction code and the countercheck code computed from the user data read out from the data memory is, according to the present invention, further used for the write cycle in order to check the error correction code generated by the error correction code unit in the write cycle. This allows to protect memories and registers according to the ISO standard 26262 against permanent and transient faults in particular in safety critical applications.

The error correction code unit and the error check unit are safety mechanisms within the meaning of this ISO standard 26262.

By monitoring the error correction code unit by use of the error check unit in the write cycle, both safety mechanisms are monitored for occurrence of latent faults. The ISO standard 26262 speaks of latent faults, if, for example, the safety mechanism itself is defective and thus errors in the functional logic would no longer be recognised.

While the prior art safety mechanisms are not only checked for permanent errors when the system is started up via Logic Bist (LBist), in the present invention, the safety mechanism is monitored frequently by comparing error correction codes and related countercheck codes not only in the read cycle, but also in the write cycle of a data memory.

The data memory can be any data memory, in particular a random access memory, a register or the like. The data memory can be provided in a separate integrated circuit or being part of an integrated circuit like a microprocessor, microcontroller, FPGA, ASIC or the like.

The electronic circuit can be easily implemented since the present invention uses the existing safety mechanisms comprising the error correction code unit (ECCGEN) and error check unit (ECCCHK/CORR) to monitor each other.

Preferably, the electronic circuit comprises at least one multiplexer unit so that the error correction code (ECC) generated from the error correction code unit and the write user data of the memory are switched to the error check unit (ECCCHK/CORR) by the multiplexer unit in the write cycle.

Thus, in one embodiment the electronic circuit preferably comprises:
  a first multiplexer comprising a first and second input and an output, wherein the user data to be written into the data memory are provided at the second input of the first multiplexer, the user data provided from the data memory when reading out from the data memory are provided at the first input of the first multiplexer, and the output of the first multiplexer is connected to an input of the error check unit, when the first multiplexer is controlled by a data memory read/write flag to provide the user data read out from the data memory in a read cycle to the input of the error check unit and to provide the user data supplied to be written into the data memory in the write cycle to the input of the error check unit, and
  a second multiplexer having a first and second input and an output, wherein the error correction code generated by the error correction code unit for the user data to be written into the data memory is provided at the second input of the second multiplexer, the error correction code read out from the data memory when reading the related user data from the data memory in a read cycle is provided at the first input of the second multiplexer, and the output of the second multiplexer is connected to an input of the error check unit, wherein the second multiplexer is controlled by the data memory read/write flag to provide the error correction code directly obtained from the error correction code unit to the error check unit in a write cycle, and to provide the error correction code directly obtained from the data memory in a read cycle.

The first and second multiplexer can be provided as separate electronic circuits which might be separate electronic parts or separate functional units in a common integrated circuit. The first and second multiplexer can also be preferably designed to be integrally formed in a common multiplexer unit. The switching between the data (stored error correction code and stored user data) from the data memory in the read cycle and the data (generated error correction code and user data) to be written into the data memory in the write cycle are controlled by the read and write command applied to the data memory which is available e.g. at a signal line of the electronic circuit. This read/write flag is a one bit signal which is used to control the first and second multiplexer.

The aim of the first and second multiplexer is to feed the error check unit with the error correction code and user data provided at the input of the data memory to be written into the data memory in the write cycle or with the stored error correction code and the stored user data at the output of the data memory read out from the data memory in the read cycle.

Except to the multiplexer unit, there is no additional hardware required to achieve the improved electronic circuit. Further, there is no time delay caused by the additional safety check since the function of the error check unit can be performed in parallel to writing the data into the data memory.

The output of the error check unit can be provided to the input of at least one multiplexer, wherein the at least one multiplexer is controlled by the read/write flag to provide the latent flag at the output of the multiplexer in a write cycle, and to provide an error flag as a result of comparison of the stored error correction code (ECC) read from the data memory and the countercheck code (CCC) computed from the user data, which are read out from the data memory in the read cycle.

Preferably, the error check unit of the electronic circuit further comprises a second error code generation unit provided to compute the countercheck code. A check code comparison unit is arranged to compare the error correction code with the countercheck code and to set in case of a mismatch between the compared error correction code and countercheck code either a correctable error flag in case of a detected correctable error or an uncorrectable error flag in case of a detected uncorrectable error. The correctable and uncorrectable flag is set in the read cycle, while the latent fault flag is set in the write cycle.

These error flags can be signaled externally and further used internally to monitor the functioning of the error code generation units in the write cycle.

In a further improved embodiment, the error check unit comprises an error location unit arranged to locate the at least one bit position of a faulty bit detected by comparing the error correction code with the respective countercheck code. Said error check unit is arranged to set a latent fault flag in case of locating at least one bit position of a faulty bit or a correctable error flag or an uncorrectable error flag is set. Thus, the result of monitoring the functioning of the error code generation units in the write cycle by use of the correctable and uncorrectable error flags is combined with the result of location of a bit position of a faulty bit to provide a latent fault flag.

This can be implemented by use of OR gates, wherein the error check unit comprises a first OR gate providing a flag if at least one bit position of a faulty bit is indicated by a bit vector at the input of the first OR gate and a second OR gate providing the latent fault flag as output of the second OR gate, if at least one of the error flag provided by the first OR gate, the correctable error flag or the uncorrectable error flag is set at the input of the second OR gate.

Said error locating unit is adapted to work in both the write cycle and the read cycle.

In a preferred embodiment, the electronic circuit further comprises an error correction unit designed to provide corrected user data at its output as a function of an error position vector indicating the position of faulty bits of the user data at the input of the error correction unit. The error check unit further comprises a comparator unit designed to compare the user data at the input of the error correction unit with the corrected user data at the output of the error correction unit to indicate an error flag in case of a mismatch between the compared user data and the corrected user data in a write cycle. This allows an easy safety check of the functioning of the correction unit during the data procession without any time delay.

The method for self-diagnostic of a data memory comprises:
a) a write cycle with the steps of:
   Computing an error correction code from user data provided to be written into the data memory;
   Storing the computed error correction code and the related user data into the data memory;
b) a read cycle comprising the steps of:
   Reading user data and the related stored error correction code from the data memory;
   Computing a countercheck code from the user data read out from the data memory; and
   Comparing the error correction code read out from the data memory with the countercheck code to provide an error flag indicating a malfunction of the data memory in case of a mismatch.

The additional steps in the write cycle are provided of:
Computing a countercheck code from the user data provided to be written into the data memory, and
Comparing the computed error correction code with the computed countercheck code to provide a latent fault flag indicating a latent fault of the function provided to compute the error correction code to be stored into the data memory in the write cycle in case of a mismatch.

The method carried out with the above described electronic circuit preferably comprises the further steps of:
Forwarding the error correction code provided at the output of the error correction code unit and the related user data provided at the input of the error correction code unit in a write cycle to the error check unit to provide a latent fault flag in case of a mismatch in the write cycle; and
Forwarding the stored error correction code and the related stored user data read out from the data memory in the read cycle to the error check unit to provide an error flag indicating a malfunction of the data memory in a read cycle.

The latent fault flag indicates a latent fault of the safety function provided by the error correction code unit and the error check unit which are used to control the data memory to indicate any malfunctions of the data memory. The use of both the error correction code unit and error check unit in a write cycle allows a safety check of these safety functions itself. This works since the direct input of the error correction code unit, i.e. the user data, and the direct output of the error correction code unit, i.e. the computed error correction code, is directly fed into the error check unit without intermediate storage into the data memory which might be faulty. In case of a latent fault monitored by a mismatch between the error correction code and the computed countercheck code, the error is caused either by the error correction code unit when computing the error correction code or by the error check unit when computing the countercheck code. Another latent fault in the error correction code unit or error check unit might be caused by flipping of bits in a register of the error correction code unit and error check unit.

Preferably, a 1-bit-error in the user data is corrected and a correctable error flag is set by the error check unit. Any error comprising more than one bit in the user data can be indicated as an uncorrectable error by the error flag without correcting the user data.

Such correction of a 1-bit-error can be limited to the read cycle when reading out data of the memory.

In a preferred embodiment, the data memory is additionally frequently monitored by carrying out a read cycle after a write cycle in order to immediately check the correctness of the write cycle.

In the write cycle, the method preferably comprises the steps of:
Computing an error correction code ($ECC_{IN}$) from user data ($D_{IN}$) provided to be written into the data memory (RAM);
Storing the computed error correction code ($ECC_{IN}$) and the related user data ($D_{IN}$) into the data memory (RAM);
Computing a countercheck code ($CCC_{IN}$) from the user data ($D_{IN}$) provided to be written into the data memory (RAM);
Comparing the computed error correction code ($ECC_{IN}$) with the computed countercheck code ($CCC_{IN}$) to provide at least one error flag (CERR, UNCERR) indicating a malfunction in the computing of the error correction code ($ECC_{IN}$) in the first step or in the computing of the countercheck code ($CCC_{IN}$) in the third step in case of a mismatch;
Detecting the bit positions of bits identified as faulty in the processed user data ($D_{IN}$) caused by a fault when computing the countercheck code ($CCC_{IN}$); and
Checking whether at least one of the correctable error flag (CERR), uncorrectable error flag (UNCERR) is set or at least one bit position comprising a faulty bit is detected and setting a latent fault flag in case that at least one of the correctable error flag (CERR) or uncorrectable error flag (UNCERR) is set or at least one bit position comprising a faulty bit is detected.

Thus, the write cycle is also used to monitor the functioning of the computing of the error correction code and countercheck code.

In the read cycle, the method preferably comprises the steps of:
Reading user data ($D_{OUT}$) and the related stored error correction code ($ECC_{OUT}$) from the data memory (RAM);
Computing a countercheck code ($CCC_{OUT}$) from the user data ($D_{OUT}$) read out from the data memory (RAM); and
Comparing the error correction code ($ECC_{OUT}$) read out from the data memory (RAM) with the computed countercheck code ($CCC_{OUT}$) to provide at least one error flag (CERR, UNCERR) indicating a malfunction of the data memory (RAM) in case of a mismatch;

Detecting the bit positions of faulty bits in the user data ($D_{OUT}$) read out from the data memory (RAM); and Checking whether at least one of the correctable error flag (CERR), uncorrectable error flag (UNCERR) is set or at least one bit position comprising a faulty bit is detected and setting a latent fault signal in case that at least one of the correctable error flag (CERR) or uncorrectable error flag (UNCERR) is set or at least one bit position comprising a faulty bit is detected.

Thus, the read cycle is also used to monitor the functioning of the detection of the bit position of faulty bits.

Preferably, the method comprises the step of correcting the faulty bit in the user data ($D_{OUT}$) read out from the data memory (RAM) in the read cycle at the indicated bit positions.

An undetected error may occur in the detection or correction logic when unintended correcting the user data e.g. by toggling bits due to a fault in the detection or correction logic. Such an error can be detected in a subsequent processing of the corrected user data on a receiver side. The corrected user data ($D_{OUT}$) can be provided in the read cycle together with the error correction code ($ECC_{OUT}$) read out from the data memory (RAM) to a receiver. The user data can be forwarded e.g. by use of an ECC protected data bus. The unintended correction of the received corrected user data ($D_{OUT}$) can be detected by error correction check ECCCHK on the receiver side. The error correction check ECCCHK is performed on the received corrected user data ($D_{OUT}$) and the received error correction code ($ECC_{OUT}$). In case that no ECC protected memory is used at the sender side, the sender generates a correct error correction code $ECC_{GEN}$ based on the corrected user data ($D_{OUT}$). In this case, the data bus is protected by correct user data $D_{OUT}$ and corresponding error correction code $ECC_{GEN}$.

In another embodiment, the user data ($D_{IN}$, $D_{OUT}$) are compared with the corrected user data ($D_{OUT, CORR}$), which are corrected in the step of correcting the faulty bit in the user data ($D_{IN}$, $D_{OUT}$). An error flag is indicated in case of a mismatch between the compared user data ($D_{IN}$, $D_{OUT}$) and the corrected user data ($D_{OUT, CORR}$). This allows an easy safety check of the functioning of the correction unit during the data procession without any time delay and the use of the write cycle also for monitoring the functioning of the detection and correction of the bit position of faulty bits.

BRIEF DESCRIPTION OF THE DRAWINGS

The invention is disclosed by the exemplary embodiment in the enclosed drawings. It shows:

FIG. 6—Block diagram of the interconnection of the electronic circuit with a receiver by a data bus comprising an additional error check unit on the receiver side.

DETAILED DESCRIPTION OF THE INVENTION

Figure 1:
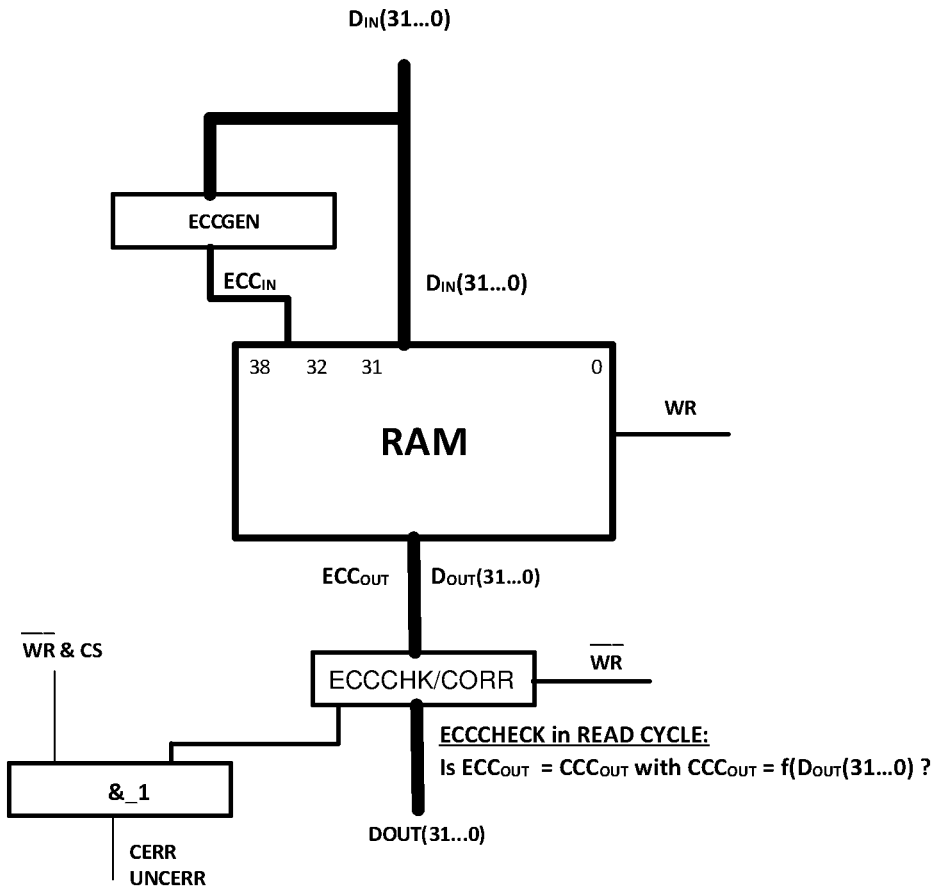
FIG. 1—Block diagram of an electronic circuit according to the prior art.

FIG. 1 presents a block diagram of an electronic circuit according to the prior art for self-diagnosis of a data memory RAM according to the prior art. User data $D_{IN}$ (31 ... 0) are provided by user to be written into the data memory RAM to store the data at a specific location. The user data $D_{IN}$ is a data packet comprising a plurality of bits, i.e. one byte or as indicated a plurality of bytes each comprising 8 bit (e.g. a 4 Byte data packet). The data packet may also comprise user data $D_{IN}$ together with a storage address of the data memory RAM.

The user data $D_{IN}$ stored in the data memory RAM can be read out, which is called stored user data $D_{OUT}$ (31 ... 0) in the following.

In order to continuously check the function of the data memory RAM, a first error correction code unit $ECCGEN_1$ is provided which is designed to compute an error correction code $ECC_{IN}$ from the user data $D_{IN}$ (31 ... 0) which is provided to be written into the data memory RAM.

Said write user data $D_{IN}$ (31 ... 0) are fed into the first error correction code unit $ECCGEN_1$ which computes the error correction code $ECC_{IN}$ as a function of the user data $D_{IN}$ (31 ... 0) to be stored into the data memory RAM. The function can be for example a Hamming code, an HSIAO code, Reed Solomon code or the like. This can be implemented in hardware, as programmable logic unit controlled by a software algorithm or completely in software running on a data processor of the electronic circuit.

The error correction code $ECC_{IN}$ computed by the first error correction code unit $ECCGEN_1$ is then stored into the data memory RAM together with the related user data $D_{IN}$ (31 ... 0).

This is controlled by a write flag WR on a signal line indicating a write cycle for storing data into the data memory RAM.

Reading out of data of the data memory RAM is controlled by a read flag, which is, for example, the inverse of the write flag WR on the signal line.

In a read cycle, the user data $D_{OUT}$ (31 ... 0) is read out together with the related stored error correction code $ECC_{OUT}$ and forwarded to an error check unit ECCCHK. The error check unit is designed to compute a countercheck code $CCC_{OUT}$ from the user data $D_{OUT}$ (31 ... 0), which are read out from the data memory RAM, and to compare the countercheck code $CCC_{OUT}$ with the error correction code $ECC_{OUT}$ which is read out of the data memory RAM together with the related user data $D_{OUT}$ (31 ... 0) in the read cycle.

Therefore, the error check unit ECCCHK is controlled by the read flag $\overline{WR}$ on the signal line, which also controls the data read cycle for the data memory RAM.

The check and the read cycle determines whether the stored and read out error correction code $ECC_{OUT}$ is similar to the computed countercheck code $CCC_{OUT}$ which is computed with the function of the user data $D_{OUT}$ (31 ... 0) read out from the data memory RAM.

In case that a malfunction occurred with the data memory RAM e.g. by flipping of at least one bit, there is a difference between the error correction code $ECC_{OUT}$ and the computed countercheck code $CCC_{OUT}$. The error check unit ECCCHK provides error flags for corrected errors CERR and uncorrectable errors UNCERR.

The error check unit ECCCHK comprises, in a preferred embodiment, a correction unit correcting the user data $D_{OUT}$ (31 . . . 0) in case of an error. A 1-bit-error can be easily corrected so that the error flags ERR indicates a corrected error CERR. In case that the error is not correctable, this is indicated by the uncorrectable error flag UNCERR.

The error flags CERR and UNCERR can be provided to an AND logic &_1 controlled by the read flag $\overline{WR}$ and a chip select flag CS.

At the output of the error check unit ECCCHK, the user data $D_{OUT}$ (31 . . . 0), which is read out of the data memory RAM and possibly corrected by the correction logic, is provided.

This prior art electronic circuit is designed to protect data memories RAM against transient and permanent errors by protection with an error correction code.

The use of an error correction code ECC enables to detect and correct 1-bit-errors in the data memory RAM and to detect more than one bit errors, i.e. 2-bit-errors.

For example, a corresponding 7-bit-error correction code ECC can be computed from a 32-bit user data $D_{IN}$ (31 . . . 0) for example, which is provided to be written into the data memory RAM by means of a hardware $ECC_{GEN}$ wherein the error correction code ECC is written into the data memory RAM together with the user data $D_{IN}$ (31 . . . 0).

When reading out for example a memory line from the data memory RAM, the read out user data $D_{OUT}$ (31 . . . 0) is checked with another hardware unit, namely the error check unit ECCCHK against the error correction code $ECC_{OUT}$ that has also been read out.

In the event of a 1-bit error in the user data $D_{OUT}$ (31 . . . 0), it is recognised via the error check unit ECCCHK and corrected via hardware ECCORR and a correctable error flag CERR is set.

In the event of any 2-bit-error in the user data $D_{OUT}$ (31 . . . 0), it is recognised via the error check unit ECCCHK and an uncorrectable error flag UNCERR is set.

The first error correction code unit $ECCGEN_1$ and the error check unit ECCCHK are safety mechanisms within the meaning of ISO standard 26262. The function of the error correction unit ECCCORR is safety critical in the read cycle, since an unintended correction of the output data would result in the following system working with wrong data. The standard only requires that an error must be reported but it does not need to be corrected, so that a correction unit in the electronic circuit and a respective safety monitoring procedure for controlling the functioning of the correction unit in the write cycle is optional.

According to the ISO standard 26262, a latent fault is present if, for example, the safety mechanism itself is defective and thus errors in the functional logic would no longer be recognised. The prior art safety mechanism according to FIG. 1 does not check the safety mechanism or only check the same for permanent errors when the system is started via a Logic Bist (LBist).

Figure 2:
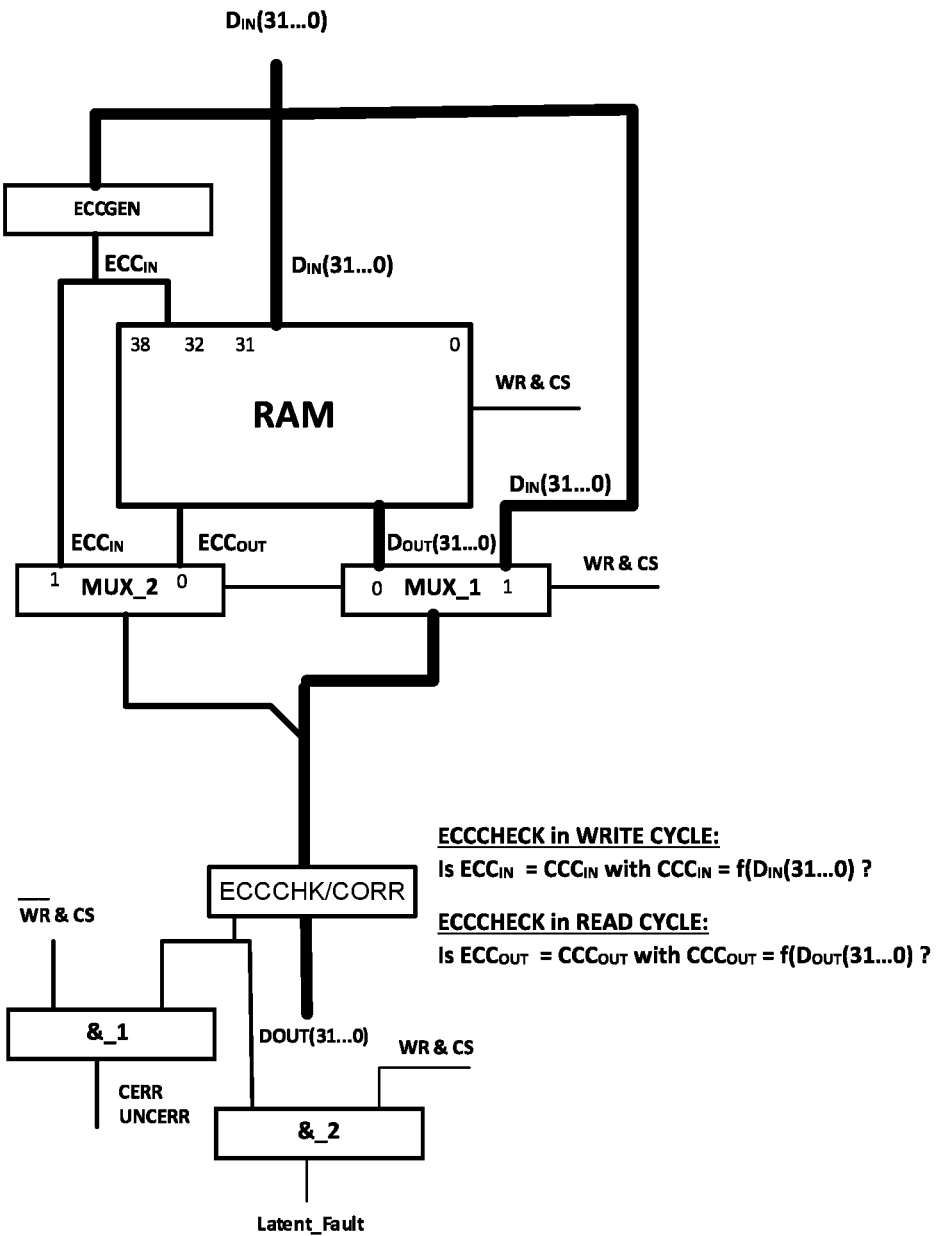
FIG. 2—Block diagram of an exemplary embodiment of the electronic circuit according to the present invention.

FIG. 2 presents a block diagram of an electronic circuit according to the present invention. The electronic circuit comprises the data memory RAM, the first error correction code unit $ECCGEN_1$ and the error check unit ECCCHK together with the AND-Logic (&_1) according to the prior art electronic circuit according to FIG. 1.

In addition, there is a first multiplexer MUX_1 and a second multiplexer MUX_2 provided wherein both outputs of the first and second multiplexer MUX_1 and MUX_2 are connected to the input of the error check unit ECCCHK.

A first input of the first multiplexer MUX_1 is connected to the data memory RAM to provide the read out user data $D_{OUT}$ (31 . . . 0) from the data memory RAM to the input of the first multiplexer.

A second input of the first multiplexer MUX_1 is connected to the write user data $D_{IN}$ (31 . . . 0) which are provided by user to be written into the data memory RAM.

The first input of the second multiplexer MUX_2 is connected to the data memory RAM to provide the stored error correction code $ECC_{OUT}$ which are related to the user data $D_{OUT}$ (31 . . . 0) provided to the second input of the first multiplexer MUX_1.

The second input of the second multiplexer MUX_2 is connected to the output of the first error correction code unit $ECCGEN_1$ to provide the computed error correction code $ECC_{IN}$ to the input of the second multiplexer.

The first and second multiplexer MUX_1 and MUX_2 are controlled by the write and read flag on the signal line in addition to the chip select CS signal related to the data memory RAM.

When the write flag together with the chip select CS command is present on the data memory RAM and the first and second multiplexer MUX_1 and MUX_2, the second input is selected for the write cycle to provide to the user data $D_{IN}$ (31 . . . 0) and the error correction code ECC directly obtained from the first error correction code unit $ECCGEN_1$ and calculated as function of the user data $D_{IN}$ (31 . . . 0) and to be written into the data memory RAM to the input of the error check unit ECCCHK. In this write cycle the error check unit computes a countercheck code CCC as a function of the user data $D_{IN}$ (31 . . . 0) provided to be written into the data memory RAM and to check the error correction code ECC directly obtained from the first error correction code unit $ECCGEN_1$ against this countercheck code CCC. The error check unit computes an error flag which is handled as latent fault flag by use of a second AND-Logic&_2 which is controlled by the write flag and the chip select flag on the signal line (WR&CS) which indicates the actual write cycle of writing the digital memory RAM.

In case that a mismatch is detected by the error check unit ECCCHK, a latent fault flag i.e. a digital "1" bit is set indicating a malfunction of the safety mechanism provided by the first error correction code unit $ECCGEN_1$ and the error check unit ECCCHK.

In the read cycle, the second AND-Logic is disabled due to the read flag (inverse of the write flag). Thus, the first AND-Logic&_1 is enabled when the error check unit ECCCHK indicates an uncorrectable error in the error flag at the output of the error check unit. Thus, the output of the first AND-Logic provides an indication of a correctable error CORR and an uncorrectable error UNCORR. A repeated indication of correctable memory errors indicates a latent fault in the memory with the risk of uncorrectable errors.

In this read cycle, the stored error correction code $ECC_{OUT}$ and the stored user data $D_{OUT}$ (31 . . . 0), which are read out from the data memory (RAM), are forwarded to the input of the error check unit ECCCHK to countercheck the stored error correction code $ECC_{OUT}$ against a countercheck code CCC computed as function of the stored, read out user data $D_{OUT}$ (31 . . . 0).

This is a function corresponding to the prior art solution explained with FIG. 1.

The electronic circuit in FIG. 2 thus uses the existing safety mechanisms established by the first error correction code unit $ECCGEN_1$ and the error check unit ECCCHK to monitor each other in the write cycle. The error correction code ECC generated from the first error correction code unit $ECCGEN_1$ and the write user data $D_{IN}$ (31 ... 0) of the data memory RAM are switched to the error check unit ECC-CHK by the multiplexer unit comprising the first and second multiplexer, in the write cycle.

Should there be a 1-bit-error or double-bit-error in the first error correction code unit $ECCGEN_1$ or in the error check unit ECCCHK, it would be identified and signalled via the latent fault flag.

With every write access to the data memory RAM, the safety mechanisms are checked without any need of software with a high diagnostic coverage (DC). The diagnostic coverage DC is 100%.

The monitoring of the safety mechanism takes place in the write cycle in parallel to writing the user data $D_{IN}$ (31 ... 0) into the data memory simply by forwarding the existing error correction code ECC and user data $D_{IN}$ (31 ... 0) to the error check unit ECCCHK and running this error check unit ECCCHK also in this write cycle.

The electronic circuit can be implemented completely in hardware as part of a data memory RAM integrated circuit or as part of a larger logic structure, like a microcontroller, microprocessor, FPGA, ASIC or other logic circuit comprising a memory unit. A memory unit in the meaning of the present invention includes also a data register. The electronic circuit can be designed in combination with any kind of memory including RAM-memory, registers, a non-volatile memory or the like.

Figure 3:
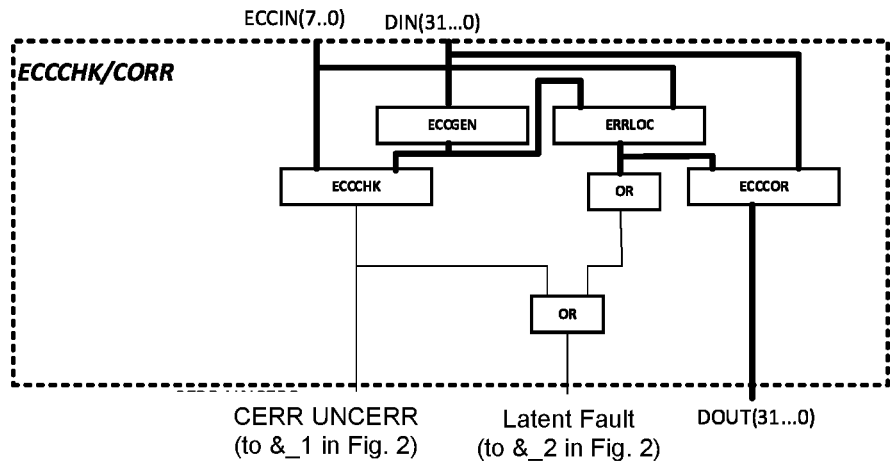
FIG. 3*a*)—Block diagram of an exemplary embodiment of the error check unit comprising an error correction unit for the electronic circuit in FIG. 2.
FIG. 3*b*)—Block diagram of the error check unit in FIG. 3*a*) comprising an additional comparator for safety check of the error correction unit.
Figure 3:
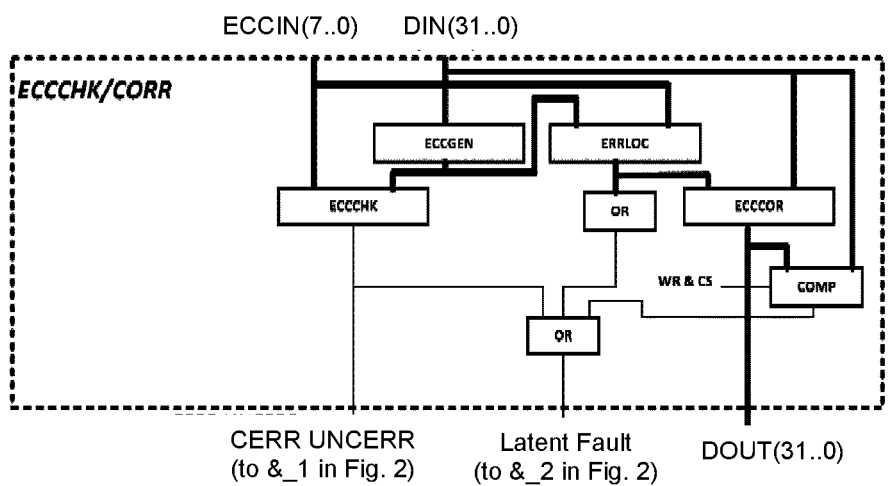

FIG. 3 a) is a block diagram of an exemplary embodiment of the error check unit ECCCHK/CORR comprising an error correction unit ECCCOR for the electronic circuit in FIG. 2.

The safety objective of ISO 26262 does not stipulate that an error signed by error flags (CORR, UNCORR, latent fault) must necessarily be corrected. However, no erroneous correction may be performed during reading if no error is present.

An error in the error correction logic ECCCOR or the error check logic ECCCHK that results in an "unintended" correction of the initial date would be a violation of the safety objectives of ISO 26 262 since the system would continue to operate with incorrect data. Therefore, it is advantageous to monitor a large part of the correction logic ECCCOR, which can be part of the error check unit ECCCHK/CORR, already during the write cycle.

A simple and fast check of the two fault cases during the write cycle can be done by the logic exemplarily shown in the block diagram of FIG. 3.

The error check unit ECCCHK/CORR comprises a second error correction code unit $ECCGEN_2$ to compute the countercheck code $CCC_{OUT}$ similar to the first error correction code unit $ECCGEN_1$ provided to compute the error correction code $ECC_{IN}$ shown in FIG. 2. This happens in each cycle, the read and write cycle, for the user data $D_{IN}$ (31 ... 0) stored in the data memory in the write cycle and the user data $D_{OUT}$ (31 ... 0) read out from the memory RAM in the read cycle. The error check function ECCCHK compares the error correction code $ECC_{IN}$ with the countercheck code $CCC_{OUT}$ and sets either the correctable error flag CERR in case of a detected correctable e.g. 1-bit-error or the uncorrectable error flag UNCERR in case of a detected uncorrectable e.g. multiple-bit-error.

A flag can be a digital state (Zero or One), wherein the digital ZERO may indicate no error, i.e. no correctable for the CORR flag or no uncorrectable error for the UNCORR flag respectively, and a digital ONE may indicate an error, i.e. a correctable error for the CORR flag or an uncorrectable error for the UNCORR flag respectively.

In the read cycle, these CORR and UNCORR flags are indicated at the output of the &_1 logic.

The error check unit ECCCHK/CORR further comprises an error location unit ERRLOC arranged to locate the at least one bit position of a faulty bit. The error location unit ERRLOC compares the error correction code $ECC_{IN}$ with the respective countercheck code $CCC_{OUT}$ and provides a bit vector (31 ... 0) indication e.g. a digital ONE in the bit vector at the faulty bit positions and a digital ZERO at the correct bit positions. The error location unit ERRLOC can be designed as a 32 Bit vector gate having the 8 bit error correction code $ECC_{IN}$ and the 8 bit countercheck code $CCC_{OUT}$ as input data and a 32 bit error position vector as output.

The error position vector is forwarded to the input to an error correction unit ECCCOR to correct the bits of the user data $D_{IN}$ (31 ... 0) provided to the second input of the error correction unit ECCCOR. The error correction unit ECC-COR can be designed to toggle the respective bit indicated as faulty by the error position vector. The output of the error correction unit ECCCOR provides the corrected user data $D_{OUT}$(31 ... 0).

The (e.g. 32 bit) error position vector is forwarded to the input of a first OR gate OR 1 which indicates an error flag at the output once at least one bit of the error position vector indicates the existence of a faulty bit.

In order to monitor the functioning of the error control logic, the error check function providing the CORR/UN-CORR flags is performed both for the read and write cycle. The CORR/UNCORR flags are internally used as input of a second OR gate $OR_2$ to provide the latent fault flag in case that an error is detected by the error check logic in the read or write cycle indication an correctable or uncorrectable error. Such an error indicates a malfunction of either the first or second error code generation unit $ECCGEN_{1/2}$.

The output of the first OR gate $OR_1$, which indicates an error flag, is also forwarded to the input of the second OR gate $OR_2$ to provide the latent fault flag in case that an error is detected by the error location unit ECCLOC.

At least the error location unit ERRLOC runs in the read and write cycle. The error correction unit ECCCOR can also work in the write cycle, even if the resulting corrected user data $D_{OUT}$ (31 ... 0) at its output are unused for this write cycle.

Two errors can be differentiated:
a) Error in the first error code generation unit $ECCGEN_1$ provided to compute the error correction code $ECC_{IN}$ or error in the second error code generation unit $ECCGEN_2$ provided to compute the countercheck code $CCC_{OUT}$ in both the write or read cycle;
b) The first and second error code generation units $ECCGEN_{1/2}$ are error-free, but the error location logic ECCLOC is faulty, which would lead to an incorrect correction of the data.

For the first error type a), in both cases either the correctable error CORR or uncorrectable error UNCORR flag would be recognized internally in the ECCCHK/CORR module. This then leads in consequence to a setting of the latent fault flag due to the second OR gate $OR_2$.

For the second error type b), the latent fault flag would be set as well. In case that ECCCHK does not indicate any error by comparing the error correction code $ECC_{IN}$ and the countercheck code $CCC_{OUT}$ but the error location unit ERRLOC locates a faulty bit position by analyzing the same error correction code $ECC_{IN}$ and countercheck code $CCC_{OUT}$, there is a malfunction in the error location unit ERRLOC. This is detected by the second OR logic $OR_2$ for the CERR flag, the UNCERR flag and the error flag at the output of the first OR gate $OR_1$.

Generally it can be stated that every correction during the write cycle leads to a setting of the latent fault Flag, independent of whether the error lies in the $ECC_{GEN}$ or ECCCHK or ERRLOC logic.

FIG. 3 b) is a block diagram of an exemplary improved embodiment of the error check unit ECCCHK/CORR shown in FIG. 3 a). In addition, the error check unit ECCCHK/CORR comprises an optional comparator COMP provided for function check of the error correction unit ECCCOR in the write cycle. The user data $D_{IN}$, $D_{OUT}$ at the input of the error correction unit ECCCOR and the corrected user data $D_{OUT, CORR}$ at the output of the error correction unit ECCCOR are provided at the input of the comparator, which is designed to compare the user data $D_{IN}$, $D_{OUT}$ with the corrected user data $D_{OUT, CORR}$. In case of a mismatch between these two user data and corrected user data in the write cycle WR, an error flag is indicated, which is forwarded to an input of the second OR gate $OR_2$.

Any malfunction of the error correction logic ECCCOR is detected by the second OR logic $OR_2$ for the CERR flag, the UNCERR flag, the error flag at the output of the first OR gate $OR_1$, and the error flag of the comparator COMP.

Figure 4:
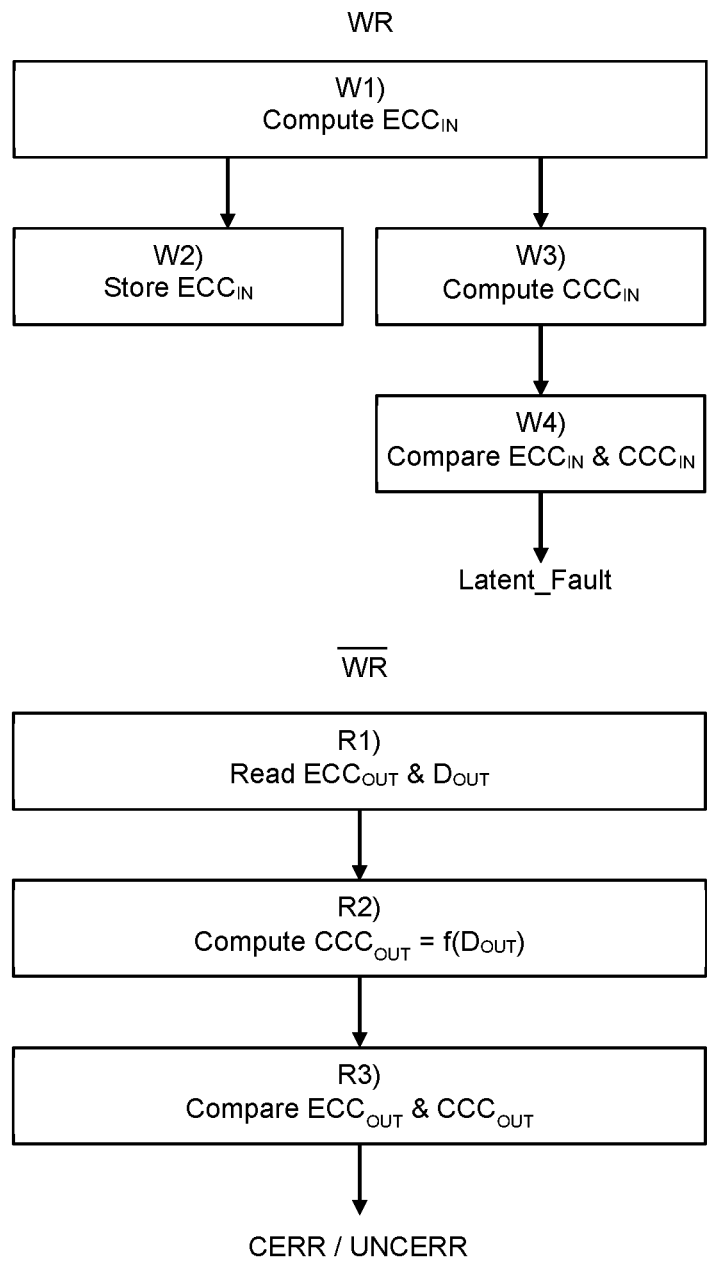
FIG. 4—Flow diagram of the method for self-diagnosis of a data memory.

FIG. 4 is a flow diagram of the method of self-diagnosis of a data memory comprising a write cycle WR for writing user data to a data memory RAM and a read cycle $\overline{WR}$ for reading out data of the data memory RAM.

The write cycle comprises the steps of:
W1) Computing an error correction code ECC from the user data $D_{IN}$ (31 . . . 0) provided to be written into the data memory RAM, and
W2) Storing the computed error correction code ECC and related user data into the data memory,
by performing the additional steps preferably in parallel with step W1):
W3) Computing a countercheck code CCC from the user data $D_{IN}$ (31 . . . 0) provided to be written into the data memory RAM, and
W4) Comparing the computed error correction code ECC with the computed countercheck code CCC to provide a latent fault flag indicating a latent fault of the function provided to compute the error correction code ECC to be stored into the data memory RAM in the write cycle WR in case of a mismatch.

The read cycle $\overline{WR}$ comprises the steps of:
R1) Reading user data $D_{OUT}$ (31 . . . 0) and related stored error correction code $ECC_{OUT}$ from the data memory RAM,
R2) Computing a countercheck code CCC from the user data $D_{OUT}$ (31 . . . 0) read out from the data memory RAM, and
R3) Comparing the error correction code ECC, which are read out from the data memory RAM, with the countercheck code CCC to provide at least one error flag CERR, UNCERR indicating a malfunction of the data memory RAM in case of a mismatch.

Figure 5:
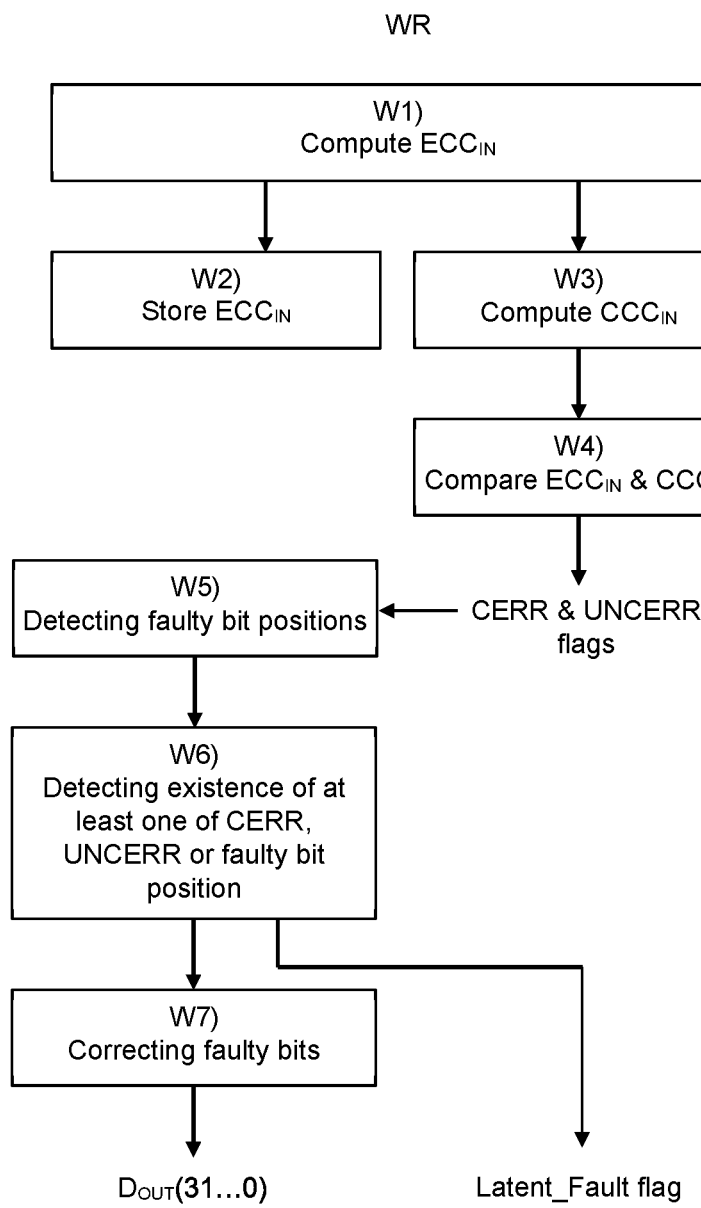
FIG. 5*a*)—Flow diagram of an improved method of FIG. 4 comprising a correction step in the write cycle.
FIG. 5*b*)—Flow diagram of an improved method of FIG. 4 comprising a correction step in the read cycle.
Figure 5:
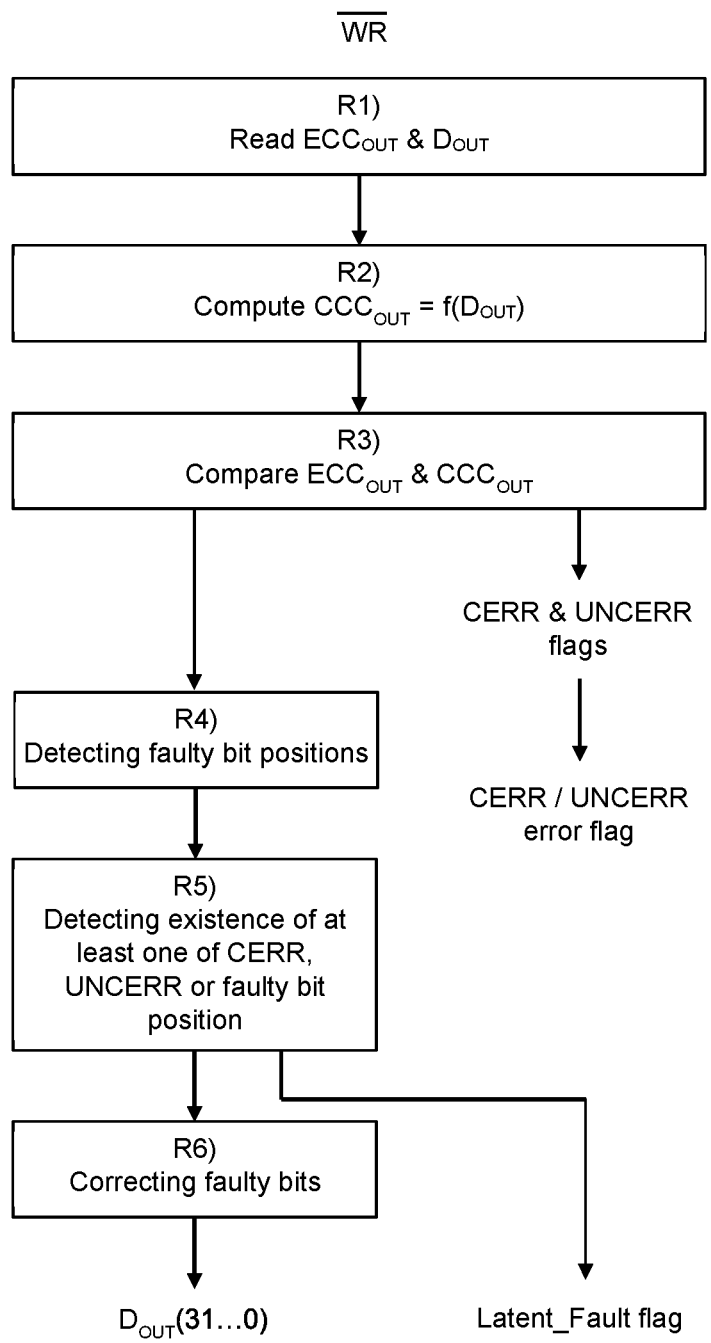

FIG. 5 shows an improved flowchart of the method in FIG. 4 comprising the amended and additional steps of
W4) Comparing the computed error correction code ECC with the computed countercheck code CCC to provide at least one error flag CERR, UNCERR indicating a malfunction in the computing of the error correction code ECC in step W1) or in the computing of the countercheck code CCC in step W3) in the write cycle WR in case of a mismatch;

W5/R4) Detecting the bit positions of faulty bits in the user data $D_{IN}$ (31 . . . 0) provided to be written into the data memory RAM in the write cycle or user data $D_{OUT}$ (31 . . . 0) read out from the data memory RAM in the read cycle,
W6/R5) Checking whether at least one of the correctable error flag CORR, uncorrectable error flag UNCORR is set in step W4/R3) or at least one bit position comprising a faulty bit is detected in step W5/R5).

In step W6/R5, the latent fault flag is set in case that at least one of the correctable error flag (CERR) or uncorrectable error flag (UNCERR) is set or at least one bit position comprising a faulty bit is detected.

In the read cycle, the further improved method comprises the step
W7/R6 Correcting the faulty bit in the user data $D_{OUT}$ (31 . . . 0) read out from the data memory RAM in the read cycle at the bit positions indicated in step W5/R4, e.g. by toggling the respective bits.

The step W7/R6 is not monitored and a malfunction could occur in this step e.g. due to faulty memory or registers or due to toggle errors in the correction step W7. This can be detected on a receiver side when providing the corrected user data $D_{OUT}$ (31 . . . 0) at the output of step W7/R6 together with the error correction code ($ECC_{OUT}$) read out from the data memory (RAM). Such a pair of user data and related error correction code can be given e.g. to an ECC protected data bus and forwarded to the receiver, where the receiver performs the above ECC check ECCCHK. In this case the wrong correction on the sender side will be detected by the receiver system.

FIG. 6 shows a block diagram of the interconnection of a part of the electronic circuit comprising a data memory RAM and the error check unit ECCCHK including the error correction unit CORR. The output of the error check unit ECCCHK/CORR is connected to a data bus B so that the error correction code $ECC_{OUT}$ and the related corrected user data $D_{OUT}$ (31 . . . 0) are communicated to at least one receiver via the data bus B. The receiver is shown at the bottom of the data bus B with its parts, which are relevant for the present invention. The receiver comprises an additional error check unit ECCCHK on the receiver side.

Depending on the configuration by use of a configuration signal CONFIG controlling a multiplexer, either the error correction code $ECC_{OUT}$ or a generated error correction code $ERR_{GEN}$ calculated by an error correction code unit $ECC_{GEN}$ of the sender is provided at the input of the error check unit ECCCHK. The corrected user data $D_{OUT}$ (31 . . . 0) are present at the other input of the error check unit ECCCHK. Thus, the error check unit ECCCHK is able to check the validity of the error correction code $ECC_{OUT}$ and the received corrected user data $D_{OUT}$ (31 . . . 0).

In case that an additional ECCGEN logic is provided at the input of the data bus for providing an ECC controlled data bus, e.g. as implemented feature in a data memory unit, it is advisable to disable this $ECC_{GEN}$ logic when communicating the pair of corrected user data $D_{OUT}$ (31 . . . 0) and error correction code ($ECC_{OUT}$) to the receiver via the data bus. The use of an additional ECC check logic at the input of the data bus is counter-productive, because the pair of corrected user data $D_{OUT}$ and $ECC_{OUT}$ will always be correct.

An unintended correction of user data can be monitored by the ECC check logic ECCCHK at the receiver side protecting the data bus. The incorrect user data $D_{OUT}$ on the data bus will be detected by the destination. In case of no fault in the correction logic, the data bus is protected with the use of the corrected data and related and correct error check code.

What is claimed is:

1. An electronic circuit for self-diagnosis of a data memory comprising
   a first error correction code unit for generating an error correction code from user data to be written into the data memory, wherein the electronic circuit is arranged to write the user data and the related error correction code into the data memory;
   an error check unit for calculating a countercheck code from user data which is read out from the data memory, and comparing the countercheck code with the error correction code which is read out of the data memory together with the related user data, wherein the error check unit is arranged to provide an error flag in case of a difference between the error check code and the countercheck code,
   wherein
   the electronic circuit is arranged to feed the user data written into the memory and the related error correction code into the error check unit in the write cycle when writing the user data and the related error correction code into the data memory to provide a Latent Fault flag in case of a determined difference between the error correction code and the countercheck code calculated from the user data by the error check unit.

2. The electronic circuit according to claim 1, wherein the electronic circuit comprising
   a first multiplexer comprising a first and second input and an output, wherein the user data to be written into the data memory are provided at the second input of the first multiplexer, the user data provided from the data memory when reading out from the data memory are provided at the first input of the first multiplexer, and the output of the first multiplexer is connected to an input of the error check unit, when the first multiplexer is controlled by a data memory read/write flag to provide the user data read out from the data memory in a read cycle to the input of the error check unit and to provide the user data supplied to be written into the data memory in the write cycle to the input of the error check unit, and
   a second multiplexer having a first and second input and an output, wherein the error correction code generated by the first error correction code unit for the user data to be written into the data memory is provided at the second input of the second multiplexer, the error correction code read out from the data memory when reading the related user data from the data memory in a read cycle is provided at the first input of the second multiplexer, and the output of the second multiplexer is connected to an input of the error check unit, wherein the second multiplexer is controlled by the data memory read/write flag to provide the error correction code directly obtained from the first error correction code unit to the error check unit in a write cycle, and to provide the error correction code directly obtained from the data memory in a read cycle.

3. The electronic circuit according to claim 2, wherein the first and second multiplexer are integrally formed in a common multiplexer unit.

4. The electronic circuit according to claim 1, wherein the output of the error check unit is provided to an input of at least one logic unit, wherein the at least one logic unit is controlled by the read/write flag to provide the Latent Fault flag at the output of the at least one logic unit in a write cycle as a result of comparison of the computed error correction code computed from the user data provided to be written into the data memory and the countercheck code computed from said user data to be written into the data memory in the write cycle, and to provide an error flag as a result of comparison of the stored error correction code read from the data memory and the countercheck code computed from the user data which are read out from the data memory in the read cycle.

5. The electronic circuit according to claim 1, wherein the error check unit comprises a second error code generation unit provided to compute the countercheck code and a check code comparison unit arranged to compare the error correction code with the countercheck code and to set in case of a mismatch between the compared error correction code and countercheck code either a correctable error flag in case of a detected correctable error or an uncorrectable error flag in case of a detected uncorrectable error.

6. The electronic circuit according to claim 5, wherein the error check unit comprises an error location unit arranged to locate the at least one bit position of a faulty bit detected by comparing the error correction code with the respective countercheck code, wherein said error check unit is arranged to set a Latent Fault flag in case of locating at least one bit position of a faulty bit or a correctable error flag or an uncorrectable error flag is set, and wherein said error locating unit is adapted to work in both the write cycle and the read cycle.

7. The electronic circuit according to claim 6, wherein the error check unit comprises a first OR gate providing a flag if at least one bit position of a faulty bit is indicated by a bit vector at the input of the first OR gate and a second OR gate providing a latent fault signal as output of the second OR gate, if at least one of the error flag provided by the first OR gate, the correctable error flag or the uncorrectable error flag is set at the input of the second OR gate.

8. The electronic circuit according to claim 1, wherein the error check unit comprises an error correction unit designed to provide corrected user data at its output as a function of an error position vector indicating the position of faulty bits of the user data at the input of the error correction unit, wherein the error check unit further comprises a comparator unit designed to compare the user data at the input of the error correction unit with the corrected user data at the output of the error correction unit to indicate an error flag in case of a mismatch between the compared user data and the corrected user data in a write cycle.

9. A method for self-diagnosis of a data memory comprising:
   a) a write cycle comprising the steps of:
   Computing an error correction code from user data provided to be written into the data memory;
   Storing the computed error correction code and the related user data into the data memory;
   b) a read cycle comprising the steps of,
   Reading user data and the related stored error correction code from the data memory;
   Computing a countercheck code from the user data read out from the data memory; and
   Comparing the error correction code read out from the data memory with the countercheck code to provide an error flag indicating a malfunction of the data memory in case of a mismatch; wherein the write cycle further includes:
   Computing a countercheck code from the user data provided to be written into the data memory, and Comparing the computed error correction code with the computed countercheck code to provide a Latent Fault flag indicating a latent fault of the function provided to compute the error correction code to be stored into the data memory in the write cycle in case of a mismatch.

10. A method for self-diagnosis of a data memory executed by the electronic device according to claim 1, comprising:

a) a write cycle comprising the steps of:

Computing an error correction code from user data provided to be written into the data memory;

Storing the computed error correction code and the related user data into the data memory;

b) a read cycle comprising the steps of,

Reading user data and the related stored error correction code from the data memory;

Computing a countercheck code from the user data read out from the data memory; and Comparing the error correction code read out from the data memory with the countercheck code to provide an error flag indicating a malfunction of the data memory in case of a mismatch; wherein the write cycle further includes:

Computing a countercheck code from the user data provided to be written into the data memory, and Comparing the computed error correction code with the computed countercheck code to provide a Latent Fault flag indicating a latent fault of the function provided to compute the error correction code to be stored into the data memory in the write cycle in case of a mismatch, the method further comprising:

Forwarding the error correction code provided at the output of the error correction code unit and the related user data provided at the input of the error correction code unit in a write cycle to the error check unit to provide a Latent Fault flag in case of a mismatch in the write cycle; and Forwarding the stored error correction code and the related stored user data read out from the data memory in the read cycle to the error check unit to provide an error flag indicating a malfunction of the data memory in a read cycle.

11. The method according to claim 9, wherein a 1-bit-error in the user data is corrected and a correctable error flag is set, and wherein any error comprising more than one bit in the user data is indicated as uncorrectable error by the error flag without correcting the user data.

12. The method according to claim 9, wherein the write cycle comprises the steps of:

Computing an error correction code from user data provided to be written into the data memory;

Storing the computed error correction code and the related user data into the data memory;

Computing a countercheck code from the user data provided to be written into the data memory;

Comparing the computed error correction code with the computed countercheck code to provide at least one error flag indicating a malfunction in the computing of the error correction code in the first step or in the computing of the countercheck code in the third step in case of a mismatch;

Detecting the bit positions of bits identified as faulty in the processed user data caused by a fault when computing the countercheck code; and Checking whether at least one of the correctable error flag, uncorrectable error flag is set or at least one bit position comprising a faulty bit is detected and setting a Latent Fault flag in case that at least one of the correctable error flag or uncorrectable error flag is set or at least one bit position comprising a faulty bit is detected.

13. The method according to claim 9, wherein the read cycle comprises the steps of:

Reading user data and the related stored error correction code from the data memory;

Computing a countercheck code from the user data read out from the data memory; and Comparing the error correction code read out from the data memory with the computed countercheck code to provide at least one error flag indicating a malfunction of the data memory in case of a mismatch;

Detecting the bit positions of faulty bits in the user data read out from the data memory; and Checking whether at least one of the correctable error flag, uncorrectable error flag is set or at least one bit position comprising a faulty bit is detected and setting a latent fault signal in case that at least one of the correctable error flag or uncorrectable error flag is set or at least one bit position comprising a faulty bit is detected.

14. The method according to claim 12, characterized in the step of correcting the faulty bit in the user data which are read out from the data memory in the read cycle at the indicated bit positions.

15. The method according to claim 9, characterized by providing the corrected user data in the read cycle together with the error correction code read out from the data memory to a receiver and checking the correctness of the received corrected user data on the receiver side.

16. The method according to claim 14, characterized by comparing the user data with the corrected user data, which are corrected in the step of correcting the faulty bit in the user data and indicating an latent fault signal in case of a mismatch between the compared user data and the corrected user data in the write cycle.

* * * * *